United States Patent [19]

Bordui et al.

[11] Patent Number: 5,343,827
[45] Date of Patent: Sep. 6, 1994

[54] METHOD FOR CRYSTAL GROWTH OF BETA BARIUM BORATEAN

[75] Inventors: Peter F. Bordui, Menlo Park; George D. Calvert, Sunnyvale, both of Calif.

[73] Assignee: Crystal Technology, Inc., Palo Alto, Calif.

[21] Appl. No.: 838,628

[22] Filed: Feb. 19, 1992

[51] Int. Cl.$^5$ .............................................. C30B 7/08
[52] U.S. Cl. .................................... 117/28; 423/158; 423/278; 117/74
[58] Field of Search ....... 156/621, 622, 624, DIG. 78, 156/DIG. 86; 423/158, 279

[56] References Cited

U.S. PATENT DOCUMENTS

| | | | |
|---|---|---|---|
| 4,761,202 | 8/1988 | Bordui et al. | 156/621 |
| 4,793,894 | 12/1988 | Jacco et al. | 156/624 |
| 4,931,133 | 6/1990 | Gualtieri et al. | 156/621 |

FOREIGN PATENT DOCUMENTS 3279298 12/1991 Japan .

OTHER PUBLICATIONS

Journal of Crystal Growth, 79, "Flux Growth of Large Single Crystals of Low Temperature Phase Barium Metaborate" by A. Jiang, F. Cheng, Q. Lin, Z. Cheng and Y. Zheng, pp. 963–969, dated 1986.
Journal of Crystal Growth, 97, "Growth of β–Barium Borate from NaCl–Na$_2$O Solutions" by D. Gualtieri and B. Chai, pp. 613–616, dated 1989.
Journal of Crystal Growth, 97, "Studies on Flux Systems for the Single Crystal Growth of β–BaB$_2$O$_4$" by Q. Huang and J. Liang, pp. 720–724, dated 1989.
Journal of Crystal Growth, 106, "β–Barium Borate Single Crystal Grown by a Direct Czochralski Method" by K. Itoh and F. Marumo, pp. 728–731, dated 1990.
Journal of Crystal, 89, "Growth and Characterization of Low Temperature Phase Barium Metaborate Crystals" by L. K. Cheng, W. Bosenberg and C. L. Tang, pp. 553–559, dated 1988.
Journal of Crystal Growth, 97, "Solution Growth of Barium Metaborate Crystals by Top Seeding" by R. S. Feigelson, R. J. Raymakers and R. K. Route, pp. 352–366, dated 1989.

Primary Examiner—R. Bruce Breneman
Assistant Examiner—Felisa Garrett
Attorney, Agent, or Firm—Joseph S. Codispoti

[57] ABSTRACT

A method of growing optical quality beta barium borate; crystals from a pure NaCl fluxed melt. The method comprises maintaining particular thermal field conditions throughout the melt and slowly cooling the melt to cause beta barium borate to crystallize from the melt. The rate of cooling may be at a rate of not greater than 3° C. per day. The method may utilize a seed crystal, suspended into the melt, so that the beta barium borate may crystallize on the seed crystal.

20 Claims, 2 Drawing Sheets

METHOD FOR CRYSTAL GROWTH OF BETA BARIUM BORATEAN

TECHNICAL FIELD

The invention generally relates to the manufacture of beta barium borate. In particular, the invention relates to a method for crystal growth of beta barium borate using a fluxed melt of pure sodium chloride, NaCl.

BACKGROUND OF THE INVENTION

Beta barium borate ($\beta$-BaB$_2$O$_4$; BBO) is a non-linear optical material that is a low temperature form of barium borate. In single crystal form, BBO has been shown to be useful in a broad range of applications for modulation and frequency conversion of laser radiation. BBO has been shown to be particularly useful as a second harmonic generator or "doubler" for laser systems to obtain a different frequency radiation from a laser having a fundamental frequency. BBO is valuable in such laser systems because the material is an efficient harmonic generator, has a high optical damage threshold, has a large birefringence, and has good mechanical and thermal properties. In addition, BBO has a wide transmission region and, moreover, is essentially transparent to ultraviolet light having wavelengths as short as 190 nm.

However, it is not possible at present to grow single crystals of BBO of sufficient size and quality for large-scale applications. Consequently, the use of BBO crystals has been limited.

Standard melt growth techniques for the manufacture of suitable BBO crystals are precluded by a destructive solid-state phase transition near 925° C. A metastable melt growth technique has been described in the Journal of Crystal Growth 106, BETA BARIUM BORATE SINGLE CRYSTAL GROWN BY A DIRECT CZOCHRALSKI METHOD by K. Itoh and F. Marumo, pp 728-731, dated 1990 (Itoh, et al.). However, due to the inherently large thermal gradients applied to the growing crystals, such a technique is likely to have shortcomings in producing large BBO crystals of high optical quality.

BBO can also be crystallized from solution below the phase transition temperature. This requires a solution to dissolve barium borate and to supersaturate BBO upon cooling to cause crystals of BBO to nucleate and grow or, alternatively, to cause a "seed" crystal set in contact with the solution to grow in size.

The most widely-reported solution growth technique involves high-temperature solution growth using sodium oxide, Na$_2$O, as a solvent and seeded growth at the surface of the solution. The use of this technique has been described in the Journal of Crystal Growth 89, GROWTH AND CHARACTERIZATION OF LOW TEMPERATURE PHASE BARIUM METABORATE CRYSTALS by L. K. Cheng, W. Bosenberg and C. L. Tang, pp. 553-559, dated 1988 (Cheng, et al.) and the Journal of Crystal Growth 97, SOLUTION GROWTH OF BARIUM METABORATE CRYSTALS BY TOP SEEDING by R. S. Feigelson, R. J. Raymakers and R. K. Route, pp. 352-366, dated 1989 (Feigelson, et al.). However, as noted by Itoh, et al., Cheng et al. and Feigelson et al., the resulting BBO crystals tend to suffer from the presence of optical inhomogeneities due to inclusion of growth solution. This is particularly troublesome if large optical elements for commercial applications are desired and inclusion cannot be controlled.

Immersion seeded growth techniques using Na$_2$O as a solvent have also been reported. The use of this technique has been described in the Journal of Crystal Growth 79, FLUX GROWTH OF LARGE SINGLE CRYSTALS OF LOW TEMPERATURE PHASE BARIUM METABORATE by A. Jiang, F. Cheng, Q. Lin, Z. Cheng and Y. Zheng, pp. 963-969, dated 1986 (Jiang, et al.) and U.S. Patent No. 4,793,894 to J. Jacco and G. Loiacono (Jacco, et al.). However, due to the inherent surface energy anisotropies using this technique, the resulting BBO crystals take the form of thin needles or sheets which do not have any practical or useful dimensions, especially for large-scale applications.

Solution growth techniques using pure sodium chloride, NaCl, as a solvent have also been reported. The use of this technique has been described in U.S. Patent No. 4,931,133 to D. Gualtieri and B. Chai (Gualtieri, et al.), the Journal of Crystal Growth 97, GROWTH OF $\beta$-BARIUM BORATE FROM NaCl-Na$_2$O SOLUTIONS by D. Gualtieri and B. Chai, pp. 613-616, dated 1989 (Gualtieri, et al. II) and the Journal of Crystal Growth 97, STUDIES ON FLUX SYSTEMS FOR THE SINGLE CRYSTAL GROWTH OF $\beta$-BaB$_2$O$_4$ by Q. Huang and J. Liang, pp. 720-724, dated 1989 (Huang, et al.). However, both Gualtieri, et al. and Gualtieri, et al. II report that pure NaCl is not suitable as a solvent for crystal growth of BBO for optical applications because of the inherently undesirable shape of the resulting BBO crystals, spurious nucleation, and uncontrollable solvent volatilization. Huang, et al. also describes solvent volatilization problems with the use of a pure NaCl solvent.

Consequently, there is a need to develop a method to grow single crystals of BBO of sufficient size and quality for large-scale applications. Further, there is a need to develop a solution growth technique that avoids spurious nucleation and minimizes solvent volatilization and that results in BBO crystals having minimum inclusions and desirable shapes with practical and useful dimensions.

SUMMARY OF THE INVENTION

Briefly, the invention provides methods of growing BBO crystals using a pure NaCl solvent with thermally well-controlled immersion-seeded solution growth techniques.

One method carried out in accordance with the present invention grows crystalline $\beta$-BaB$_2$O$_4$ from a NaCl fluxed melt by maintaining particular thermal field conditions throughout said melt and slowly cooling the melt to cause $\beta$-BaB$_2$O$_4$ to crystallize from the melt. The slowly cooling step may comprise cooling the fluxed melt at a rate of not greater than 3° C. per day. The method may also include a step of suspending a seed crystal of BaB$_2$O$_4$ in the fluxed melt to cause $\beta$-BaB$_2$O$_4$ to crystallize from said melt on said seed crystal.

The fluxed melt may comprise a molar ratio of NaCl/fluxed melt from about 0.6 to about 0.85. The slowly cooling step may also comprise cooling the fluxed melt from an initial temperature chosen to correspond to the solubility of BaB$_2$O$_4$ in NaCl. In such case, the fluxed melt may comprise a molar ratio of NaCl/fluxed melt from about 0.6 to about 0.85 with the initial temperature ranging from about 870° C. to about 770° C.

The invention also provides a method of growing a crystal of β-BaB$_2$O$_4$ from solution comprising the steps of preparing a mixture of a BaB$_2$O$_4$ solution and a pure NaCl solvent; heating the mixture to produce a melt thereof; maintaining particular thermal field conditions throughout said melt; suspending a seed crystal of BaB$_2$O$_4$ in the melt; and slowly decreasing the temperature of the melt to cause β-BaB$_2$O$_4$ to crystallize from the melt on the seed crystal. The step of suspending a seed crystal may also comprise rotating the seed crystal in the melt. The step of slowly decreasing the temperature may comprise decreasing the temperature of the melt at a rate not greater than about 3° C. per day.

The step of slowly decreasing the temperature may also comprise decreasing the temperature of the melt from an initial temperature chosen to correspond to the solubility of BaB$_2$O$_4$ in NaCl. The melt may comprise a molar ratio of NaCl/melt from about 0.6 to about 0.85. Further, the step of slowly decreasing the temperature may comprise decreasing the temperature of said melt from an initial temperature from about 870° C. to about 770° C. corresponding with the molar ratio of NaCl/melt.

The invention further provides a method of growing a single crystal boule of β-BaB$_2$O$_4$ comprising the steps of preparing a mixture of BaB$_2$O$_4$ and a flux comprising pure NaCl; heating the mixture in a crucible enclosed within a furnace so as to raise the temperature of the mixture to a first temperature to form a melt of said mixture and to maintain particular thermal field conditions throughout the melt; homogenizing the melt; immersing a seed crystal of β-BaB$_2$O$_4$ mounted on the end of a seed crystal holder into the melt; rotating the seed crystal holder and the seed crystal within the melt; and slowly decreasing the temperature of the melt while continuing to rotate the seed crystal holder and the seed crystal to cause β-BaB$_2$O$_4$ to crystallize from the melt onto said seed crystal to form the boule.

The homogenizing step may comprise stirring the melt while maintaining the temperature at the first temperature and discontinuing the stirring and, thereupon, reducing the temperature to a second temperature lower than the first temperature. The rotating step may comprise rotating the seed crystal holder and the seed crystal with regular reversals of direction within the melt. The step of slowly decreasing the temperature may comprise decreasing the temperature of the melt at a rate of no greater than 3° C. per day.

The method may also comprise the steps of moving the seed crystal holder relative to the crucible so as to remove the newly grown boule from the melt but retain the newly grown boule in the furnace and decreasing the temperature of the furnace to ambient temperature and retaining the seed crystal holder and the newly grown boule in the furnace until the newly grown boule has thermally stabilized.

The method may also comprise the step of cooling the homogenized melt so as to decrease the temperature of the melt from an initial temperature chosen to correspond to the solubility of BaB$_2$O$_4$ in NaCl. The melt may comprise the molar ratio of NaCl:melt in the range of about 0.6 to about 0.85. The method may also comprise the step of cooling the homogenized melt so as to decrease the temperature of the melt from about 870° C. to about 770° C. corresponding with the molar ratio of NaCl:melt.

Advantageously, the invention provides for methods for growing single crystals of BBO of sufficient size and quality for large-scale applications. Further, the solution growth techniques of the present invention avoids spurious nucleation and minimizes solvent volatilization resulting in BBO crystals having minimum inclusions and desirable shapes with practical and useful dimensions.

BRIEF DESCRIPTION OF THE DRAWINGS

For a better understanding of the invention, reference is made to the following description of an exemplary embodiment thereof, and to the accompanying drawings, wherein.

DETAILED DESCRIPTION

Figure 1:
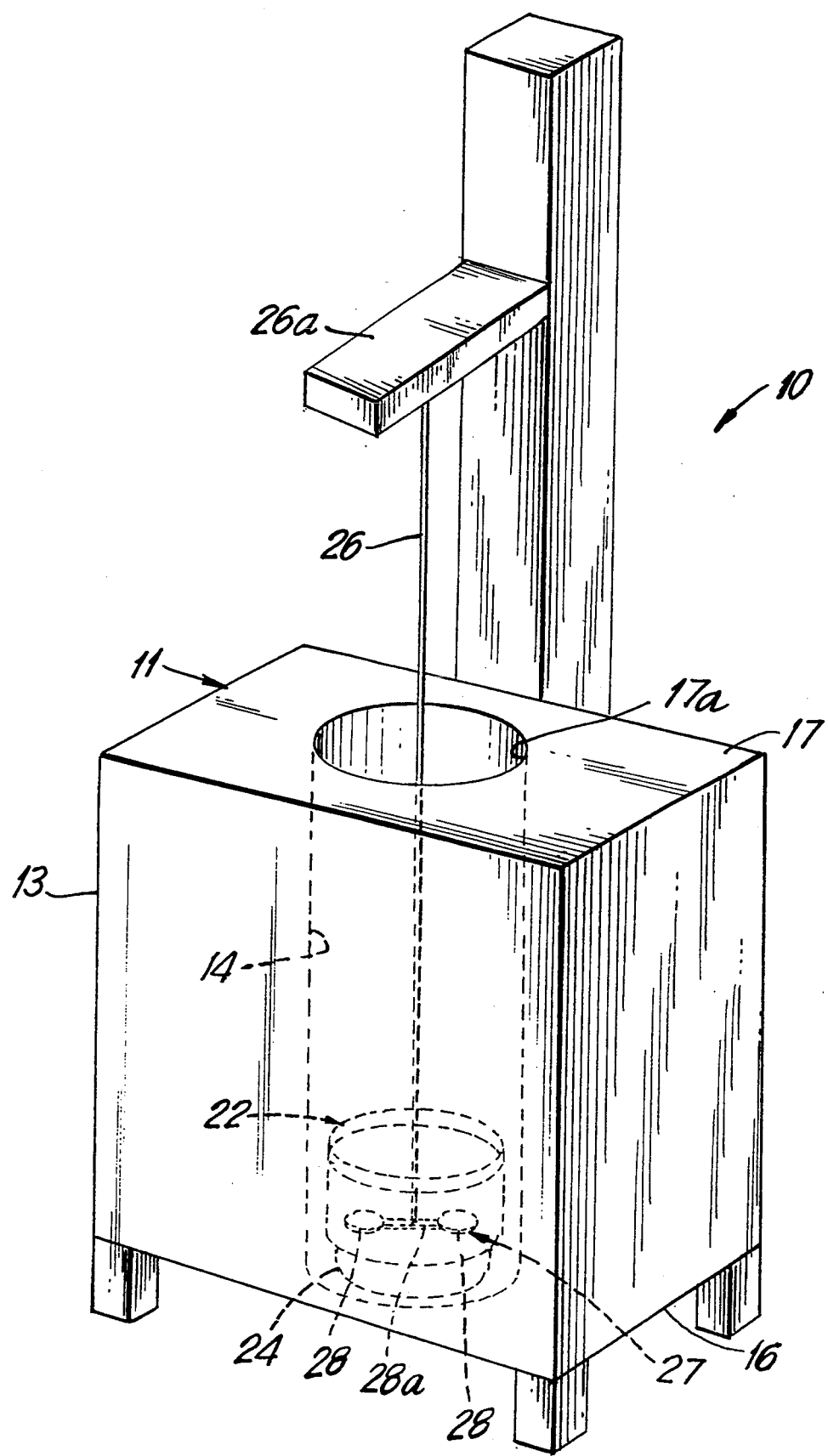
FIG. 1 is a schematic representation of an apparatus used to carry out a BBO crystal-growing method of the present invention.

FIG. 1 is a schematic representation of an apparatus 10 used to carry out a BBO crystal-growing method of the present invention. The apparatus 10 comprises a growth furnace 11 that has an insulated frame 13 configured to define a vertical cylindrically-shaped furnace cavity 14, a base plate 16 extending along the bottom surface of the furnace 11, and a top plate 17 extending along the top surface of the furnace 11 provided with a central opening 17a, the area of which corresponds approximately with the horizontal area cross-section of the furnace cavity 14. The frame 13 may be multi-layered, comprising, for example, an outer layer of steel, silica, or any other appropriate material and an inner layer of insulation. Both the base plate 16 and the top plate 17 may be composed of steel, silica, or any other appropriate material. The furnace 11 may also have a removable ceramic plate (not shown), provided with a central opening, that covers a portion of the top plate 17. The ceramic plate may incorporate a heating element to aid in heating the furnace cavity 14. Note that the furnace 11 of the apparatus 10 may also be any commercially available furnace used for growing crystals.

The furnace cavity 14 is configured to contain a crucible 22 which may be cylindrical and formed of platinum and a crucible support or base 24 which may be ceramic. The furnace cavity 14 also contains heating elements (not shown), such as a resistance wound heater, with the corresponding temperature controls to provide heat to the furnace 11, producing the desired temperature cycle as described herein and maintaining selected thermal field conditions. The temperature controls may also be used to direct the operation of the ceramic plate heating element. The furnace cavity 14 may also contain an isothermal heat pipe liner (not shown) defining an inner cavity to contain the crucible 22 that permits better control of the thermal field conditions within the crucible 22. Note that the temperature controls may be connected to a suitable logic element or computer (not shown) programmed to operate the furnace 11 heating.

Figure 2:
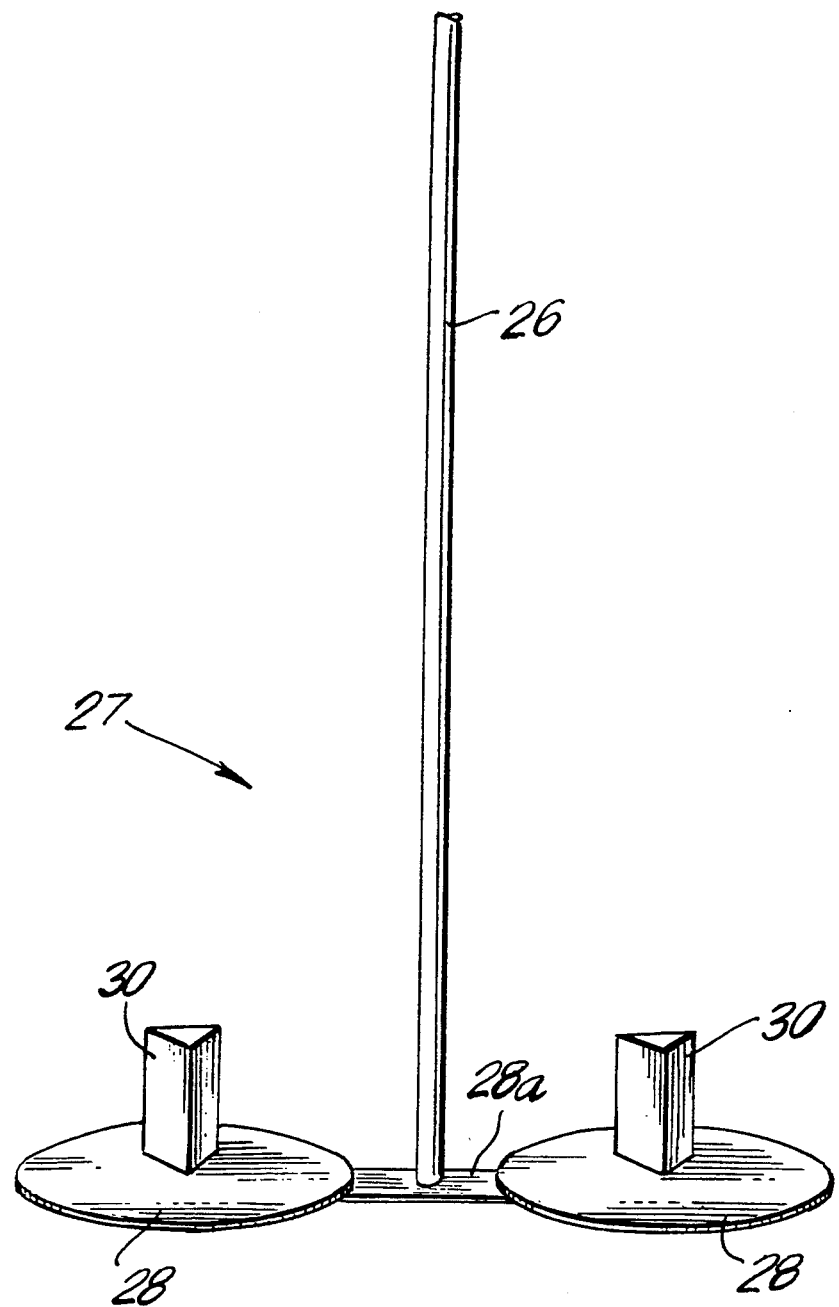
FIG. 2 is a schematic representation of a BBO crystal seed holder platform used with the apparatus of FIG. 1 to carry out a BBO crystal-growing method of the present invention.

The apparatus 10 further comprises a rotatable and translatable shaft 26 that is suspended from a controlled reversible motor (not shown) contained in an overhead arm 26a. The shaft 26 extends through the central opening 17a of the top plate 17 and into the furnace cavity 14. The free end of the shaft 26 extends into the crucible 22. The shaft 26 has at its free end a seed crystal holder 27 which is shown in greater detail in FIG. 2. The holder 27 comprises a plurality of seed crystal platforms 28 formed integrally on the ends of at least one rod 28a affixed to the shaft 26. The holder 27 is configured to hold one or more BBO seed crystals 30, and the resultant grown crystals, and may be formed of platinum. The holder 27 may be configured to be integral to the shaft 26 or removably attached to the shaft 26. Also, each platform 28 may take on any configuration to hold a respective BBO crystal 30 which may, for example, be drill-mounted thereon.

It has been found that a method of growing BBO crystals using a pure NaCl solvent with a thermally well-controlled immersion-seeded solution growth technique enables the successful growth of large, inclusion-free BBO crystals of superior optical quality. Such a method avoids spurious nucleation in the solution and has minimal solvent volatilization. The growth technique used may be analogous to the technique described in U.S. Pat. No. 4,761,202 used to grow crystals of compounds having the unit formula $MTiOXO_4$ (where M is K, Tl, Rb or mixtures thereof and X is P or As).

Using a method carried out in accordance with the present invention, BBO crystals were produced by first adding measured amounts of sodium chloride (NaCl) to a barium borate solution. The solution was mixed; heated to a temperature at which all the solids were in the solution; and then slowly cooled over a period of days to a substantially lower temperature. At all times during the method, particular thermal field conditions for the solution were well-controlled and maintained. BBO crystals were subsequently recovered.

More particularly, a mixture of 963.8 g of powdered $BaCO_3$, 342.5 g of powdered $B_2O_3$, and 1140.6 g of powdered NaCl was ball-milled for one hour. The powdered mixture was poured into two 13.0 cm diameter by 9.9 cm high cylindrical platinum crucibles which were then placed in a muffle furnace. The internal temperature of the muffle furnace was 900° C. After 24 hours, the furnace was cooled to ambient temperature in 18 hours and the crucibles were removed from the muffle furnace. The resulting solid was removed from one crucible and added to the solid in the other crucible.

The crucible 22 filled with solid was then introduced into the growth furnace 11 as described above and set on the crucible base 24. The growth furnace 11 was heated to 900° C. in 18 hours. A platinum stirring paddle (not shown) affixed to the end of the rotatable and translatable shaft 26 was introduced into the liquid through the opening 17a at the top of the furnace cavity 14. The paddle was rotated in the liquid at 25 RPM for 24 hours during which time the temperature of the liquid was maintained at 900° C. The paddle was removed from the liquid and the furnace temperature was then ramped to an initial growth temperature of 799° C. over a period of one hour.

Two BBO seed crystals each roughly $1.0 \times 0.5 \times 0.5$ cm$^3$ were drilled and mounted onto two platinum platforms 28 on the ends of the platinum rod 28a affixed to the shaft 26. The BBO seed crystals were introduced into the furnace 11 and immersed in the center of the volume of liquid in the crucible 22. The temperature of the furnace 11 was set to continually decrease at a rate of 1.0° C. per day. The BBO seed crystals were initially rotated in the liquid at 30 RPM and the rotation direction was reversed every 2.5 revolutions. After 12 days, the platforms 28 were withdrawn 10 cm and the furnace 11 temperature was ramped down to ambient temperature at a rate of 10° C. per hour. The platforms 28 were then completely removed from the furnace 11. At all times, the temperature controls controlled and maintained selected thermal field conditions throughout the mixture, for example, an isothermal condition or an essentially spatially isothermal condition (wherein the maximum difference in temperatures between any two points in the melt is not greater than, for example, about 2° C.).

The resultant grown BBO crystals on the platforms 28 each measured roughly $5.0 \times 3.0 \times 3.0$ cm$^3$ Further, flawless clear areas were subsequently cut from these crystals that measured as large as $2.0 \times 2.0 \times 0.5$ cm$^3$. The molar ratio of NaCl to the fluxed melt (i.e., the mixture of the NaCl solvent and the barium borate solution) was about 0.827 for the initial growth temperature of 799° C. Similar BBO crystals were also grown in accordance with the method using molar ratios of NaCl/fluxed melt ranging from about 0.6 to about 0.85 for corresponding initial growth temperatures ranging from about 870° C. to about 770° C.

Note that if desired, the rate of cooling the fluxed melt may be decreased to about 0.5° C. per day. Also, for larger systems and to obtain larger-sized crystals, the rate of cooling the fluxed melt may be increased up to about 3° C. per day.

The embodiments described herein are merely illustrative of the principles of the present invention. Various modifications may be made thereto by persons ordinarily skilled in the art, without departing from the scope or spirit of the invention. For example, the method of the present invention may utilize other apparatus other than the above-described apparatus 10 to grow BBO crystals. Also, the method of the present invention may utilize other immersion-seeded solution growth techniques to grow BBO crystals.

Further, the temperature controls may maintain any particular thermal field conditions throughout the mixture (such as a selected temperature gradient in the melt) which may be predetermined and fixed or changing with time. Further, other molar ratios of NaCl/-fluxed melt and corresponding initial growth temperatures may be used.

What is claimed is:

1. A method of growing a crystal of $\beta$-$BaB_2O_4$ from solution, comprising the steps of:
    a. preparing a mixture of a $BaB_2O_4$ solution and a pure NaCl solvent;
    b. heating said mixture to produce a melt thereof;
    c. suspending a seed crystal of $BaB_2O_4$ in said melt;
    d. maintaining particular thermal field conditions throughout said melt; and
    e. decreasing the temperature of said melt to thereby cause $\beta$-$BaB_2O_4$ to crystalize from said melt on said seed crystal.

2. The method of claim 1, wherein said melt comprises a molar ratio of NaCl/melt from about 0.6 to about 0.85.

3. The method of claim 1, wherein the step of suspending a seed crystal of $BaB_2O_4$ in said melt further comprises rotating the seed crystal in said melt.

4. The method of claim 1, wherein the step of decreasing the temperature of said melt comprises decreasing the temperature of said melt at a rate not greater than about 3° C. per day.

5. The method of claim 1, wherein the step of slowly decreasing the temperature of said melt comprises decreasing the temperature of said melt from an initial temperature chosen to correspond to the solubility of $BaB_2O_4$ in NaCl.

6. The method of claim 1, wherein said melt comprises a molar ratio of NaCl/melt from about 0.6 to about 0.85 and the step of decreasing the temperature of said melt comprises decreasing the temperature of said melt from an initial temperature from about 870° C. to about 770° C. corresponding with the molar ratio of NaCl/melt.

7. A method of growing crystalline $\beta$-$BaB_2O_4$ from a NaCl fluxed melt, comprising the steps of:
   a. maintaining particular thermal field conditions throughout said melt; and
   b. slowly cooling said melt to cause $\beta$-$BaB_2O_4$ to crystallize from said melt.

8. The method of claim 7, wherein the step of slowly cooling comprises cooling said fluxed melt at a rate of not greater than 3° C. per day.

9. The method of claim 7, further comprising the step of suspending a seed crystal of $BaB_2O_4$ in said fluxed melt to cause $\beta$-$BaB_2O_4$ to crystallize from said melt on said seed crystal.

10. The method of claim 7, wherein the step of slowly cooling comprises cooling the fluxed melt from an initial temperature chosen to correspond to the solubility of $BaB_2O_4$ in NaCl.

11. The method of claim 7, wherein said fluxed melt comprises a molar ratio of NaCl/fluxed melt from about 0.6 to about 0.85.

12. The method of claim 11, wherein said fluxed melt comprises a molar ratio of NaCl/fluxed melt from about 0.6 to about 0.85 and the initial temperature ranges from about 870° C. to about 770° C. corresponding with the molar ratio of NaCl/melt.

13. A method of growing a single crystal boule of $\beta$-$BaB_2O_4$, comprising the steps of:
   preparing a mixture of $BaB_2O_4$ and a flux comprising pure NaCl;
   b. heating said mixture in a crucible enclosed within a furnace so as to raise the temperature of the mixture to a first temperature to form a melt of said mixture and to maintain particular thermal spatial conditions throughout the melt;
   c. homogenizing the melt;
   d. immersing a seed crystal of $\beta$-$BaB_2O_4$ mounted on the end of a seed crystal holder into the melt;
   e. rotating the seed crystal holder and the seed crystal within the melt; and
   f. decreasing the temperature of the melt while continuing to rotate the seed crystal holder and the seed crystal to cause $\beta$-$BaB_2O_4$ to crystallize from the melt onto said seed crystal to form the boule.

14. The method of claim 13, wherein the step of homogenizing the melt comprises:
   a. stirring the melt while maintaining the temperature of the melt at the first temperature; and
   b. discontinuing the stirring and, thereupon, reducing the temperature of the melt to a second temperature lower than the first temperature.

15. The method of claim 13, wherein the step of rotating comprises rotating the seed crystal holder and the seed crystal with regular reversals of direction within the melt.

16. The method of claim 13, further comprising the steps of:
   a. moving the seed crystal holder relative to the crucible so as to remove the newly grown boule from the melt but retain the newly grown boule in the furnace; and
   b. decreasing the temperature of the furnace to ambient temperature and retaining the seed crystal holder and the newly grown boule in the furnace until the newly grown boule has thermally stabilized.

17. The method of claim 13, wherein the melt comprises the molar ratio of NaCl:melt in the range of about 0.6 to about 0.85.

18. The method of claim 13, further comprising the step of cooling the homogenized melt so as to decrease the temperature of the melt from an initial temperature chosen to correspond to the solubility of $BaB_2O_4$ in NaCl.

19. The method of claim 13, wherein the melt comprises the molar ratio of NaCl:melt in the range of about 0.6 to about 0.85 and further comprising the step of cooling the homogenized melt so as to decrease the temperature of the melt from about 870° C. to about 770° C. corresponding with the molar ratio of NaCl:melt.

20. The method of claim 13, wherein the step of slowly decreasing the temperature of the melt comprises decreasing the temperature of the melt at a rate of no greater than 3° C. per day.

* * * * *

UNITED STATES PATENT AND TRADEMARK OFFICE
CERTIFICATE OF CORRECTION

PATENT NO. : 5,343,827
DATED : Sep. 6, 1994
INVENTOR(S) : Bordui et al.

It is certified that error appears in the above-identified patent and that said Letters Patent is hereby corrected as shown below:

Column 8
    Line 5: after "f." insert --slowly--

Signed and Sealed this

Fifteenth Day of November, 1994

BRUCE LEHMAN

*Attest:*

*Attesting Officer*      *Commissioner of Patents and Trademarks*